(12) United States Patent
Terao et al.

(10) Patent No.: US 8,598,580 B2
(45) Date of Patent: Dec. 3, 2013

(54) WIRING STRUCTURE, DISPLAY APPARATUS, AND SEMICONDUCTOR DEVICE

(75) Inventors: Yasuaki Terao, Kobe (JP); Shinya Morita, Kobe (JP); Aya Miki, Kobe (JP); Katsufumi Tomihisa, Kobe (JP); Hiroshi Goto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 13/639,028

(22) PCT Filed: Mar. 30, 2011

(86) PCT No.: PCT/JP2011/058141
§ 371 (c)(1),
(2), (4) Date: Oct. 2, 2012

(87) PCT Pub. No.: WO2011/125802
PCT Pub. Date: Oct. 13, 2011

(65) Prior Publication Data
US 2013/0026470 A1  Jan. 31, 2013

(30) Foreign Application Priority Data
Apr. 2, 2010 (JP) ................. 2010-086485

(51) Int. Cl.
*H01L 29/16* (2006.01)
(52) U.S. Cl.
USPC .......................................................... 257/52
(58) Field of Classification Search
USPC .......................................................... 257/52
See application file for complete search history.

(56) References Cited

U.S. PATENT DOCUMENTS

| | | | |
|---|---|---|---|
| 6,033,542 A | 3/2000 | Yamamoto et al. | |
| 7,098,539 B2 | 8/2006 | Gotoh et al. | |
| 7,154,180 B2 | 12/2006 | Gotoh et al. | |
| 7,262,085 B2 | 8/2007 | Gotoh et al. | |

(Continued)

FOREIGN PATENT DOCUMENTS

| | | |
|---|---|---|
| JP | 2008 124450 | 5/2008 |
| WO | 2009 131035 | 10/2009 |
| WO | 2010 001998 | 1/2010 |

OTHER PUBLICATIONS

International Search Report Issued Jul. 5, 2011 in PCT/JP11/58141 Filed Mar. 30, 2011.

*Primary Examiner* — Telly Green
*Assistant Examiner* — Damian A Hillman
(74) *Attorney, Agent, or Firm* — Oblon, Spivak, McClelland, Maier & Neustadt, L.L.P.

(57) ABSTRACT

Disclosed is a wiring structure that attains excellent low-contact resistance even if eliminating a barrier metal layer that normally is disposed between a Cu alloy wiring film and a semiconductor layer, and wiring structure with excellent adhesion. The wiring structure is provided with a semiconductor layer, and a Cu alloy layer, on a substrate in this order from the substrate side. A laminated structure is included between the semiconductor layer, and the Cu alloy layer. The laminated structure is composed of a (N, C, F, O) layer which contains at least one element selected from among a group composed of nitrogen, carbon, fluorine, and oxygen, and a Cu—Si diffusion layer which includes Cu and Si, in this order from the substrate side. At least one element selected from among the group composed of nitrogen, carbon, fluorine, and oxygen that composes the (N, C, F, O) layer is bonded to Si in the semiconductor layer. The Cu alloy layer is a laminated structure containing a Cu—X alloy layer (a first layer) and a second layer.

12 Claims, 10 Drawing Sheets

(56) References Cited

U.S. PATENT DOCUMENTS

| | | |
|---|---|---|
| 7,365,810 B2 | 4/2008 | Gotoh et al. |
| 7,411,298 B2 | 8/2008 | Kawakami et al. |
| 7,553,754 B2 | 6/2009 | Gotoh et al. |
| 7,622,809 B2 | 11/2009 | Gotoh et al. |
| 7,683,370 B2 | 3/2010 | Kugimiya et al. |
| 7,781,767 B2 | 8/2010 | Kawakami et al. |
| 2004/0125257 A1 | 7/2004 | Chae et al. |
| 2006/0091792 A1 | 5/2006 | Kugimiya et al. |
| 2007/0040172 A1 | 2/2007 | Kawakami et al. |
| 2007/0295963 A1 | 12/2007 | Yano et al. |
| 2011/0121297 A1 | 5/2011 | Kawakami et al. |

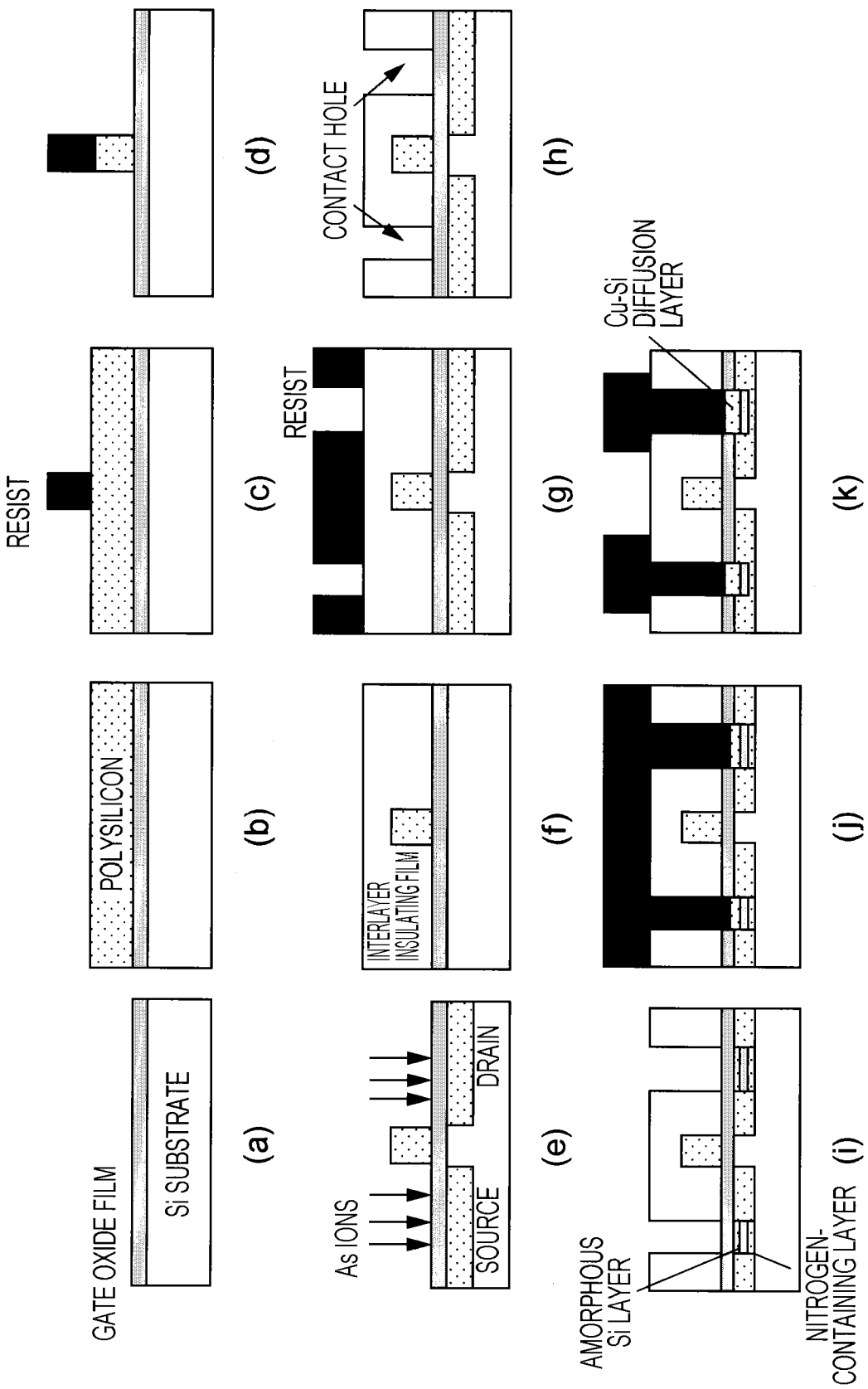

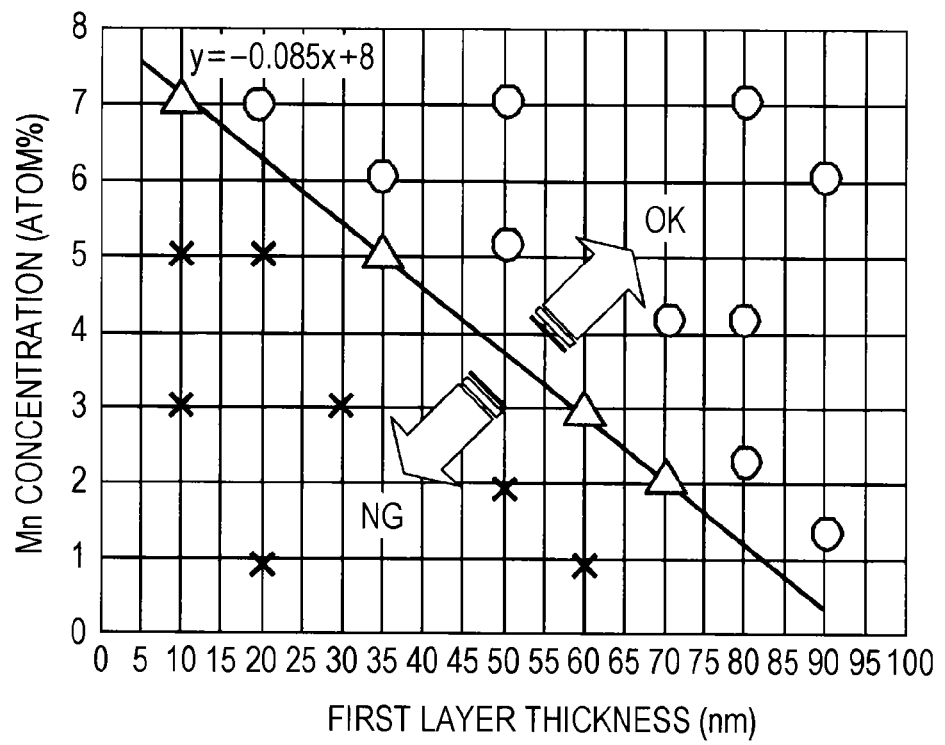

WIRING STRUCTURE, DISPLAY APPARATUS, AND SEMICONDUCTOR DEVICE

TECHNICAL FIELD

The present invention relates to wiring structures that can be applied to flat panel displays (display apparatuses) such as liquid crystal displays and organic EL displays and semiconductor devices such as ULSI (ultra large scale integration) circuits, ASICs (application specific integrated circuits), FETs (field effect transistors), and diodes, and, in particular, a wiring structure that contains a Cu alloy film as a wiring material. In the description below, wiring of thin film transistors of liquid crystal display apparatuses is described as an example but the present invention is not limited to this.

BACKGROUND ART

An active matrix-type liquid crystal display apparatus such as a liquid crystal display uses thin film transistors (hereinafter referred to as TFTs) as switching elements and is constituted by transparent pixel electrodes, wiring portions such as gate wiring and source/drain wiring, a TFT substrate that includes a semiconductor layer composed of amorphous silicon (a-Si) or polycrystal silicon (p-Si), a counter substrate that includes a common electrode and is arranged so as to face the TFT substrate with a particular distance therebetween, and a liquid crystal layer filling the gap between the TFT substrate and the counter substrate.

Aluminum (Al) alloy films have been used as a wiring material of gate wiring and source/drain wiring of a TFT substrate. However, as the size of the display devices increases and the image quality improves, a problem of signal delay and power loss attributable to high wiring resistance has become noticeable. Thus, copper (Cu), which has a lower resistance than Al, is gathering much attention as a wiring material.

When pure Cu or a Cu alloy (hereinafter generally referred to as Cu-based alloys) is used as a wiring material, a barrier metal layer composed of a refractory metal such as Mo, Cr, Ti, or W is usually interposed between a Cu-based alloy wiring film and a semiconductor layer of a TFT as described in PTL 1 to 7. This is mainly due to the following two reasons.

First, if a Cu-based alloy wiring film is directly brought into contact with a semiconductor layer of a TFT without using a barrier metal layer, Cu in the Cu-based alloy wiring film will diffuse into the semiconductor layer due to the heat history in the subsequent step (e.g., step of forming an insulating layer on the TFT or a heating step involving sintering or annealing) and thus the TFT characteristics are degraded or the contact resistance between the Cu-based alloy wiring film and the semiconductor layer is increased.

Second, when Cu in the Cu-based alloy wiring film diffuses into the semiconductor as described above and a reaction layer between the semiconductor layer and Cu is formed, the Cu-based alloy wiring film becomes detached from the semiconductor layer at this reaction layer, which is a problem. In other words, bringing the Cu alloy film and the semiconductor layer into direct contact with each other decreases the adhesion.

However, in order to form such a barrier metal layer, a system for forming a barrier metal is needed in addition to the system for forming Cu-based alloy wiring films. In particular, a film-forming system equipped with an extra film-forming chamber for forming barrier metal layers (typically, a cluster tool in which a plurality of film-forming chambers are connected to transfer chambers) must be used, and this increases the production cost and decreases the productivity.

Under this circumstance, PTL 8 describes a technology that does not use such a barrier metal layer. PTL 8 discloses a direct contact technology for a Cu-based alloy film and a semiconductor layer, and describes a wiring structure composed of a material including a Cu-based alloy film and a nitrogen-containing layer or an oxygen-nitrogen-containing layer, where N (nitrogen) in the nitrogen-containing layer or nitrogen or oxygen in the oxygen-nitrogen-containing layer is bonded to Si of the semiconductor layer.

CITATION LIST

Patent Literature

PTL 1: Japanese Unexamined Patent Application Publication No. 7-66423
PTL 2: Japanese Unexamined Patent Application Publication No. 8-8498
PTL 3: Japanese Unexamined Patent Application Publication No. 2001-196371
PTL 4: Japanese Unexamined Patent Application Publication No. 2002-353222
PTL 5: Japanese Unexamined Patent Application Publication No. 2004-133422
PTL 6: Japanese Unexamined Patent Application Publication No. 2004-212940
PTL 7: Japanese Unexamined Patent Application Publication No. 2005-166757
PTL 8: Japanese Unexamined Patent Application Publication No. 2008-118124

SUMMARY OF INVENTION

Technical Problem

The present invention has been made under the above-described circumstances and an object thereof is to provide a wiring structure that can exhibit notably low contact resistance without a barrier metal layer usually provided between a Cu-based alloy wiring film and a semiconductor layer and that offers excellent adhesion between the Cu-based alloy wiring film and the semiconductor layer

Solution to Problem

The present invention includes the following embodiments.
[1]
A wiring structure including a semiconductor layer and a Cu alloy layer on a substrate in that order from the substrate side,
wherein a multilayer structure that includes a (N, C, F, O) layer containing at least one element selected from the group consisting of nitrogen, carbon, fluorine, and oxygen and a Cu—Si diffusion layer containing Cu and Si disposed in that order from the substrate side is interposed between the semiconductor layer and the Cu alloy layer, and at least one of the elements, nitrogen, carbon, fluorine, and oxygen, constituting the (N, C, F, O) layer is bonded to Si in the semiconductor layer, and
the Cu alloy layer has a multilayer structure that includes, in that order from the substrate side, a first layer which is a Cu—X alloy layer containing at least one alloy component X selected from the group consisting of Zn, Ni, Ti, Al, Mg, Ca, W, Nb, and Mn and a second layer which is a layer composed of pure Cu or a Cu alloy mainly composed of Cu and having an electrical resistivity lower than that of the first layer.

[2] The wiring structure described in [1] wherein the X content in the first layer which is a Cu—X alloy layer is 0.5 to 20 at %.

[3] The wiring structure described in [1] or [2] wherein the thickness of the first layer which is a Cu—X alloy layer is 5 to 150 nm and 50% or less of the thickness of the Cu alloy layer as a whole.

[4] The wiring structure according to any one of [1] to [3], wherein a thickness x (nm) and an X content y (at %) of the first layer which is a Cu—X alloy layer satisfy the relationship of formula (1) below:

$$y \geq -0.085x + 8.0 \quad (1)$$

[5] The wiring structure according to any one of [1] to [4], wherein the Cu—Si diffusion layer is obtained by forming the (N, C, F, O) layer, a semiconductor layer, and the Cu alloy layer in that order and then applying a heat history.

[6] The wiring structure according to any one of [1] to [5], wherein the semiconductor layer is composed of hydrogenated amorphous silicon or amorphous silicon.

[7] A display apparatus including the wiring structure according to any one of [1] to [6].

[8] A semiconductor device including the wiring structure according to any one of [1] to [6].

Advantageous Effects of Invention

The present invention can provide a direct contact technology that enables a Cu alloy layer and a semiconductor layer to come into direct contact with each other, offers excellent contact resistance between the Cu alloy layer and the semiconductor layer, and achieves high productivity and further enlarged process margins. In particular, a technology that is less susceptible to variations in various processing conditions (variation in system performance, instability, unexpected contamination, contamination that is hard to control, etc.), that does not need stringent condition control, and that has less limitations on process conditions can be provided. Since the first layer of the Cu alloy layer is a Cu—X alloy layer (first layer) containing X as an alloy component (X is at least one selected from the group consisting of Zn, Ni, Ti, Al, Mg, Ca, W, Nb, and Mn) and the second layer is a layer composed of Cu or a Cu alloy mainly composed of Cu and having an electrical resistivity lower than that of the first layer, the adhesion to the semiconductor layer is improved, low contact resistance is achieved, and the increase in electrical resistance of the Cu alloy layer as a whole can be suppressed.

BRIEF DESCRIPTION OF DRAWINGS

FIG. 8($a$) to ($k$) are step diagrams illustrating a process of producing a MOSFET.

FIG. 9 is a graph showing the adhesion evaluation test results and the relationship between the thickness of the first layer and the Mn content in the first layer.

FIG. 10 is a graph showing the relationship between the thickness of a second semiconductor layer and the electrical resistivity of the Cu alloy layer as a whole (first layer+second layer).

DESCRIPTION OF EMBODIMENTS

The present invention relates to a direct contact technology that enables direct contact between a Cu-based alloy film and a semiconductor layer. In particular, the present invention was made on the basis of the contents of PTL 8 described above by conducting further studies mainly from the viewpoints of productivity and adhesion. The contents of PTL 8 are incorporated herein by reference.

First, it has been found that the invention disclosed in PTL 8 leads to the following problems. In order to obtain a wiring structure (structure in which a semiconductor layer comes into direct contact with a Cu-based alloy film with a nitrogen-containing layer or an oxygen-nitrogen-containing layer interposed therebetween) described in PTL 8, it is necessary to first form a semiconductor layer and a nitrogen-containing layer or an oxygen-nitrogen-containing layer in a chamber for forming semiconductor layers of a plasma CVD system (under vacuum), and then transfer the product to a special chamber (under vacuum) for forming a Cu-based alloy film by a sputtering method or the like. Studies carried out by the inventors revealed that when surfaces of the nitrogen-containing layer and the like are exposed to air and excessively contaminated during the transfer, degradation and variation of electrical characteristics (TFT characteristics and contact resistance between the semiconductor layer and the Cu-based alloy film) will result. In order to avoid these problems, studies were conducted and structures (I) to (II) below were conceived. Furthermore, it has been found that a Cu alloy layer having excellent adhesion to the semiconductor layer can be realized by employing the structure (III) below in the Cu alloy layer from the viewpoint of adhesion, low electrical resistivity, and low contact resistance.

Figure 1A:
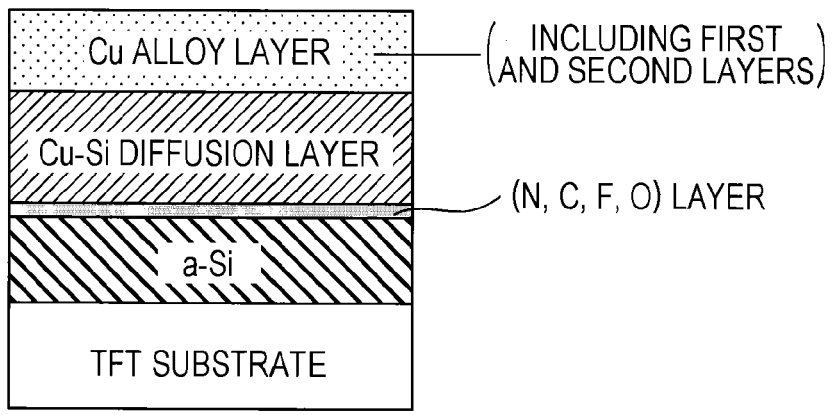
FIG. 1A is a schematic cross-sectional diagram showing a structure of a TFT according to a first embodiment of the present invention.

(I) Unlike the structure described in PTL 8, a wiring structure of the present invention is characterized in that it includes a multilayer structure including a (N, C, F, O) layer and a Cu—Si diffusion layer containing Cu and Si disposed on the (N, C, F, O) layer, as shown in FIG. 1A or the like. As shown in the schematic step diagram in FIG. 3, this Cu—Si diffusion layer is obtained by sequentially forming a semiconductor layer and a Cu alloy layer after forming a (N, C, F, O) layer, i.e., a representative example of a nitrogen-containing layer. Preferably, formation of the Cu—Si diffusion layer is promoted by a heat history applied during a subsequent TFT production step so that the Cu—Si diffusion layer is obtained as Cu in the Cu-based alloy film is made to diffuse into Si in the semiconductor layer by a heat treatment at about 150° C. or more (preferably 180° C. or more). The Cu—Si diffusion layer obtained in such a way is constituted by Cu in the Cu alloy layer and the Si of the semiconductor layer and functions as a cover layer for protecting the (N, C, F, O) layer from air. The Cu—Si diffusion layer may be directly formed on the (N, C, F, O) layer as shown in FIG. 1A or in any other way.

Figure 3:
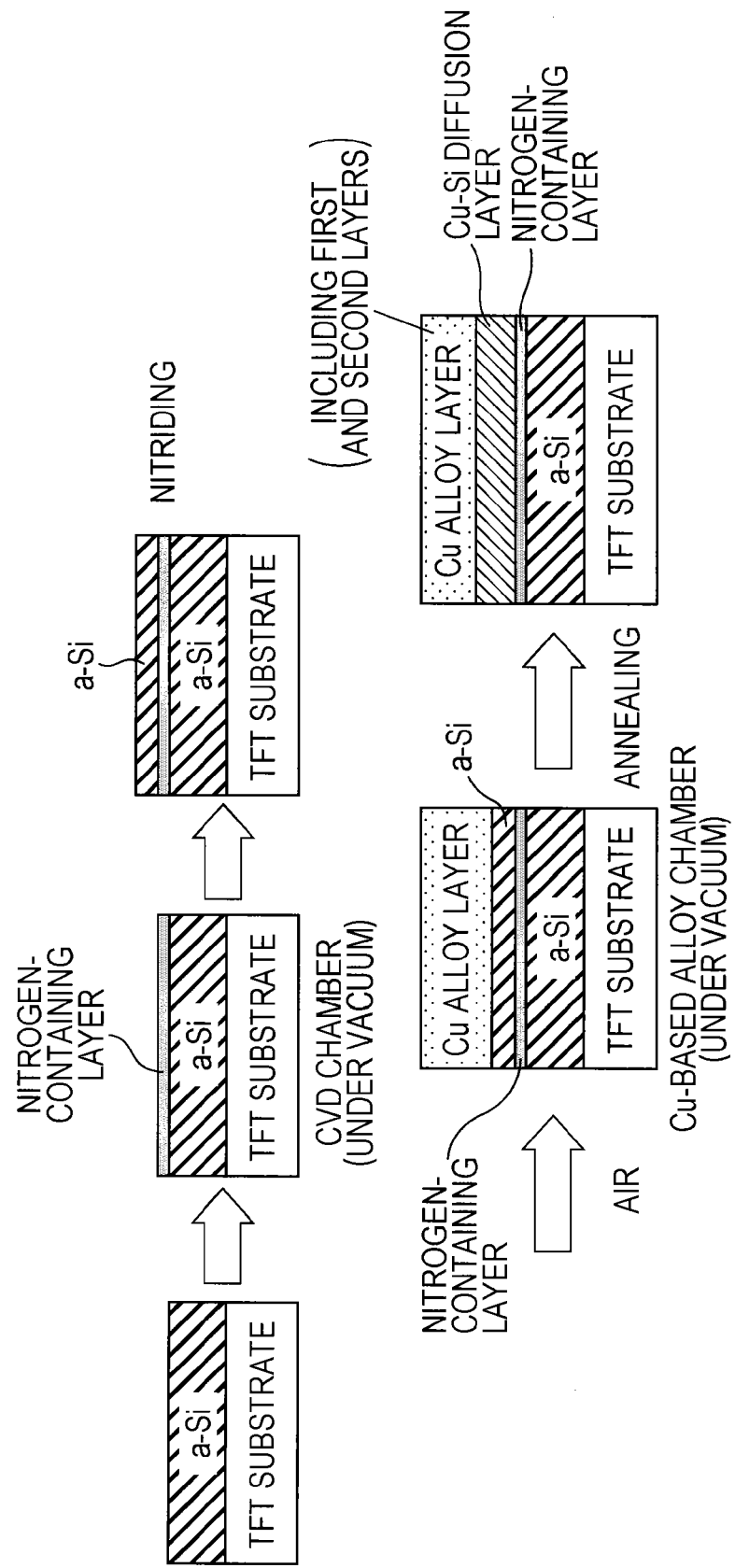
FIG. 3 is a schematic step diagram illustrating steps for forming a wiring structure according to the present invention.

A method for producing a wiring structure according to the present invention is characterized in that, as shown in the schematic step diagram of FIG. 3, after a (N, C, F, O) layer, i.e., a representative example of a nitrogen-containing layer, is formed, a semiconductor layer is formed on the (N, C, F, O) layer continuously in the same chamber unlike in PTL 8 where a Cu alloy layer is directly formed on the nitrogen-containing layer. After this process is conducted and the product is transferred to a special chamber for forming a Cu alloy film as in PTL 8, a Cu-alloy film is formed and a TFT is formed by a known method. As a result, the semiconductor layer is changed into a Cu—Si diffusion layer by the subsequent heat history. Thus, the degradation of TFT characteristics and the increase and variation in contact resistance caused by contamination of the (N, C, F, O) layer are avoided, and, thus, a direct contact technology that offers excellent electrical characteristics while securely bringing the semiconductor layer of the TFT into direct contact with the Cu-based alloy film can be provided.

(II) In the present invention, a (N, C, F, O) layer is disclosed as a barrier layer having an interdiffusion-preventing effect between the Cu alloy layer and the semiconductor layer directly formed on the TFT substrate. PTL 8 discloses a nitrogen-containing layer and an oxygen-nitrogen-containing layer as barrier layers; however, studies conducted thereafter by the present inventors have found that the same effect can be achieved with a layer containing carbon or fluorine. In particular, it was experimentally confirmed that any (N, C, F, O) layer containing at least one element selected from the group consisting of nitrogen, carbon, fluorine, and oxygen achieves substantially the same results as the nitrogen-containing layer or the oxygen-nitrogen-containing layer. Accordingly, in the present invention, the technique disclosed in PTL 8 has been further developed by using a (N, C, F, O) layer as a barrier layer. (III) The Cu alloy layer in the present invention has a multilayer structure including a first layer and a second layer. The first layer is a Cu—X alloy layer containing X as an alloy component (X is at least one selected from the group consisting of Zn, Ni, Ti, Al, Mg, Ca, W, Nb, and Mn). In the present invention, the first layer that comes into direct contact with the semiconductor layer is composed of a Cu alloy containing an alloy element that contributes to improving the adhesion and the adhesion to the semiconductor layer is improved as a result. These elements X do not increase the contact resistance between the Cu alloy layer and the semiconductor layer. In contrast, the second layer stacked on the first layer is composed of an element having low electrical resistivity (pure Cu or a Cu alloy having an electrical resistivity substantially as low as pure Cu), and the electrical resistivity of the Cu alloy layer as a whole is decreased as a result. In other words, the multilayer structure defined in the present invention effectively maximizes the characteristics inherent to Cu, i.e., that the electrical resistivity is lower than Al, while overcoming the drawback of Cu, i.e., low adhesion to the semiconductor layer.

The present invention is described in below in detail. As mentioned above, the present invention involves a technology achieved by improving the technology disclosed in PTL 8 as a foundation. PTL 8 may be referred as to the method for forming the nitrogen-containing layer and the like. In this description, the differences from PTL 8 are mainly discussed.

Figure 1B:
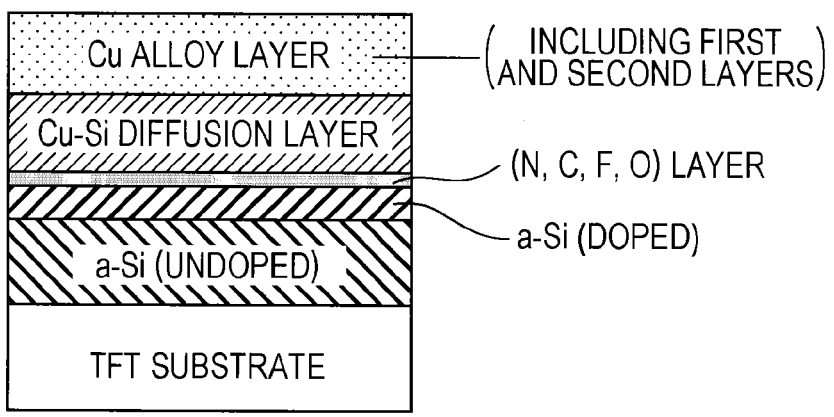
FIG. 1B is a schematic cross-sectional diagram showing a structure of a TFT according to the first embodiment of the present invention.
Figure 1C:
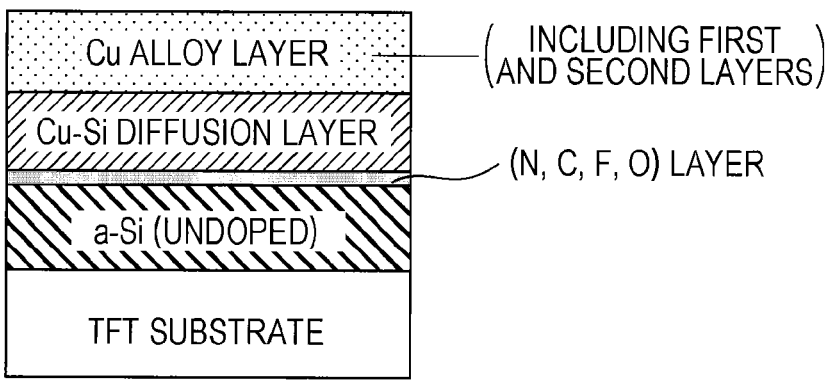
FIG. 1C is a schematic cross-sectional diagram showing a structure of a TFT according to the first embodiment of the present invention.
Figure 2:
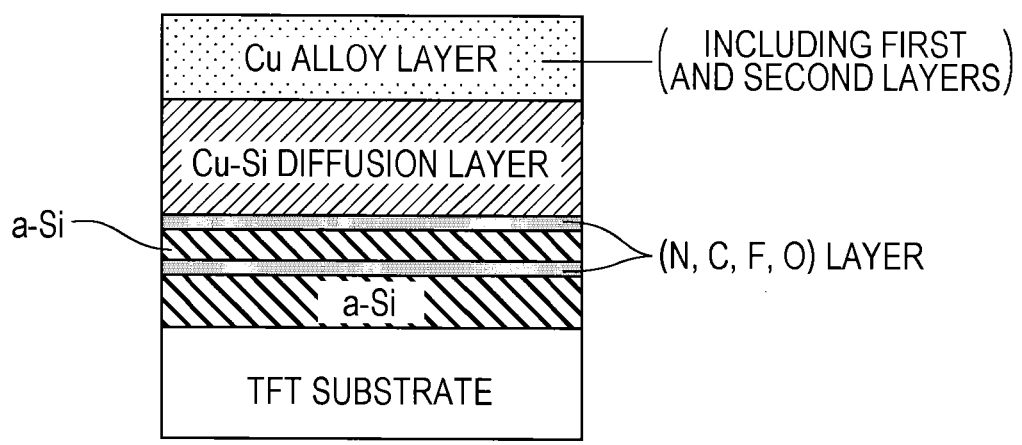
FIG. 2 is a schematic cross-sectional diagram showing a structure of a TFT according to a second embodiment of the present invention.

First, a wiring structure and a method for making the wiring structure according to the present invention are described with reference to FIGS. 1A to 1C and FIG. 2. The wiring structure according to the present invention includes a semiconductor layer and a Cu alloy layer on a substrate in that order from the substrate side, and a multilayer structure between the semiconductor layer and the Cu alloy layer, the multilayer structure including a (N, C, F, O) layer containing at least one element selected from the group consisting of nitrogen, carbon, fluorine, and oxygen and a Cu—Si diffusion layer containing Cu and Si, the (N, C, F, O) layer and the Cu—Si diffusion layer being stacked in that order from the substrate side. This multilayer structure need at least be provided between the semiconductor layer and the Cu alloy layer and, for example, the multilayer structure may be directly provided on the semiconductor layer as shown in FIGS. 1A to 1C. Alternatively, as shown in FIG. 2, two or more of (N, C, F, O) layers may be provided and the present invention includes in its scope an embodiment in which a semiconductor layer, a (N, C, F, O) layer, another semiconductor layer, and the multilayer structure described above are stacked in that order from the substrate side. The present invention is not limited by these embodiments.

First to third embodiments of the wiring structure according to the present invention are described below with reference to drawings. Wiring structures according to the present invention can be used in source/drain electrodes, TAB connection electrodes, etc., and are applicable to display apparatuses such as liquid crystal displays and organic EL displays and semiconductor devices such as ULSI, ASIC, FET, and diodes. Below, first and second embodiments directed to TFTs are described as representative examples of the display apparatuses to which the wiring structures of the present invention are applied and a third embodiment directed to a MOSFET is described as a representative example of the semiconductor layer. However, these examples should not be considered as limiting. The type of the semiconductor layer may be any of hydrogenated amorphous silicon, amorphous silicon, microcrystalline silicon, polycrystal silicon, and single crystal silicon.

In the description below, a semiconductor layer that is formed on the (N, C, F, O) layer and is capable of ultimately changing into a Cu—Si diffusion layer capable of protecting the (N, C, F, O) layer from air due to the heat history subsequently applied is referred to as a "second semiconductor layer", and a semiconductor layer directly formed on a TFT substrate is referred to as a "first semiconductor layer".

First Embodiment of the Present Invention

A first embodiment of the TFT according to the present invention is shown in FIG. 1A. A structure shown in FIG. 1A includes a first semiconductor layer on a TFT substrate; a two-layer structure directly on the first semiconductor layer, the two-layer structure including a (N, C, F, O) layer and a Cu—Si diffusion layer; and a Cu alloy layer (including a first layer and a second layer) directly on the two-layer structure. The structure shown in FIG. 1A is obtained by forming a (N, C, F, O) layer, then forming a second semiconductor layer and a Cu alloy layer (multilayer structure), and then applying a heat history at about 150° C. or higher.

In the first embodiment, the (N, C, F, O) layer contains at least one element selected from the group consisting of nitrogen, carbon, fluorine, and oxygen. Since the (N, C, F, O) layer is formed so as to substantially cover the entire surface of the semiconductor layer, the (N, C, F, O) layer effectively serves as a barrier for preventing interdiffusion of Cu and Si at the interface between the Cu alloy layer and the first semiconductor layer. The (N, C, F, O) layer is preferably a nitrogen-containing layer. In particular, nitrogen, carbon, fluorine, and oxygen constituting the layer bond with Si in the first semiconductor layer so that Si nitrides, Si carbides, Si fluorides, and Si oxides are mainly contained. The Si nitrides, Si carbides, and Si fluorides may further contain oxygen. For example, Si nitrides may be a complex compound of a Si oxynitride further containing oxygen. Oxygen-containing complex compounds such as oxynitride of Si can be obtained by allowing oxygen (O) inevitably introduced during the process of forming a nitrogen-containing layer to bond with nitrides.

The total surface density of the nitrogen atoms, carbon atoms, fluorine atoms, and oxygen atoms contained in the (N, C, F, O) layer is preferably either equal to or higher than the surface density of the effective bonds of the first semiconductor layer material (typically Si). In order to prevent interdiffusion between the Cu alloy layer and the first semiconductor layer, the surface of the semiconductor layer needs to be covered with a (N, C, F, O) layer such as a nitrogen-containing layer. In such a case, the uncombined bonds (dangling bonds) present on the surface of the semiconductor layer are preferably bonded to the elements constituting the layer. The "effective bonds" refer to bonds that can be arranged on the semiconductor layer surface despite the steric hindrance of the nitrogen atoms, carbon atoms, fluorine atoms, and oxygen atoms and the "surface density of effective bonds" refers to the surface density observed when the entire surface of the semiconductor layer is covered with the (N, C, F, O) layer. The surface density of the effective bonds differs depending on the type of the semiconductor material etc. For example, in the case of silicon, the surface density is approximately within the range of $10^{14}$ cm$^{-2}$ to $2 \times 10^{16}$ cm$^{-2}$ although this may slightly vary depending on the plane orientation of the crystals.

To be more specific, for example, when the nitrogen-containing layer mainly contains a Si nitride or when the nitrogen-containing layer mainly contains a Si nitride and further contains an oxynitride of Si, nitrogen in the nitrogen-containing layer preferably has a surface density (N1) of $10^{14}$ cm$^{-2}$ or more and $2 \times 10^{16}$ cm$^{-2}$ or less at the interface contacting the first semiconductor layer. In order to obtain desired TFT characteristics and the like, the lower limit of the surface density of nitrogen in the nitrogen-containing layer is more preferably $2 \times 10^{14}$ cm$^{-2}$ and yet more preferably $4 \times 10^{14}$ cm$^{-2}$. Similarly, carbon in the carbon-containing layer preferably has a surface density (C1) of $10^{14}$ cm$^{-2}$ or more and $2 \times 10^{16}$ cm$^{-2}$ or less, more preferably $2 \times 10^{14}$ cm$^{-2}$ or more and yet more preferably $4 \times 10^{14}$ cm$^{-2}$ or more at the interface contacting the semiconductor layer. Fluorine in the fluorine-containing layer preferably also has a surface density (F1) of $10^{14}$ cm$^{-2}$ or more and $2 \times 10^{16}$ cm$^{-2}$ or less, more preferably $2 \times 10^{14}$ cm$^{-2}$ or more and yet more preferably $4 \times 10^{14}$ cm$^{-2}$ or more at the interface contacting the first semiconductor layer. From the same viewpoint, oxygen in the oxygen-containing layer preferably has a surface density (O1) of $10^{14}$ cm$^{-2}$ or more and $2 \times 10^{16}$ cm$^{-2}$ or less, more preferably $2 \times 10^{14}$ cm$^{-2}$ or more, and yet more preferably $4 \times 10^{14}$ cm$^{-2}$ or more at the interface contacting the first semiconductor layer.

The (N, C, F, O) layer may include at least one layer containing Si—N bonds, Si—C bonds, Si—F bonds, or Si—O bonds. Here, the distance between Si and N (atomic distance) of the Si—N bond is about 0.18 nm, preferably substantially 0.2 nm or more, and more preferably 0.3 nm or more. However, when the surface density (N1) of nitrogen in the nitrogen-containing layer is excessively high, the amount of insulating Si nitrides contained in the nitrogen-containing layer also increases, thereby possibly resulting in an increase in electrical resistance and degradation of TFT performance. The upper limit of the surface density of nitrogen in the nitrogen-containing layer is more preferably $1 \times 10^{16}$ cm$^{-2}$. From the same viewpoint, the distance (atomic distance) between Si and C of a Si—C bond is about 0.19 nm, preferably substantially 0.2 mm or more, and more preferably 0.3 nm or more. The upper limit of the surface density of carbon in the carbon-containing layer is more preferably $1 \times 10^{16}$ cm$^{-2}$. From the same view point, the distance (atomic distance) between Si and F of a Si—F bond is about 0.16 nm, preferably substantially 0.18 nm or more, and more preferably 0.25 nm or more. The upper limit of the surface density of fluorine in the fluorine-containing layer is more preferably $1 \times 10^{16}$ cm$^{-2}$. The distance (atomic distance) between Si and O of a Si—O bond is about 0.13 nm, preferably substantially 0.15 nm or more, and more preferably 0.2 nm or more. The upper limit of the surface density of the oxygen in the oxygen-containing layer is more preferably $1 \times 10^{16}$ cm$^{-2}$.

The surface density (N1) of nitrogen, the surface density (C1) of carbon, the surface density (F1) of fluorine, and the surface density (O1) of the (N, C, F, O) layer described above can be calculated by, for example, using a RBS (Rutherford backscattering spectrometry) method.

When the (N, C, F, O) layer is a (N, C, F) layer not including O and contains an oxygen-containing compound such as an oxynitride of Si (e.g., when a Si oxide is further contained in addition to a Si nitride), the total surface density of the elements constituting the layer preferably satisfies the requirement described above and, in addition, the ratio of the total of the surface densities of the elements (N1, C1, and F1) to the surface density (O1) of oxygen, i.e., (N1+C1+F1)/O1, is preferably 1.0 or more. As a result, the TFT characteristics can be further enhanced. Nitrogen-containing compounds such as Si nitrides and oxygen-containing compounds such as Si oxynitrides are inherently insulators; however, since the (N, C, F, O) layer is significantly thin, i.e., about 0.18 nm or more and 5 nm or less in thickness, as described below, the electrical resistance can be suppressed to a low level.

According to the experimental results of the inventors, the TFT characteristics are affected by the ratio (N1+C1+F1)/O1 and it has been found that in order to obtain better TFT characteristics, the ratio (N1+C1+F1)/O1 may be increased to 1.0 or more. When the ratio (N1+C1+F1)/O1 is increased, the amount of resistance components in the (N, C, F, O) layer decreases and presumably thus better transistor characteristics are obtained. The ratio (N1+C1+F1)/O1 is preferably as large as possible, e.g., preferably 1.05 or more and more preferably 1.1 or more.

The ratio (N1+C1+F1)/O1 can be adjusted by, for example, properly controlling the plasma generation conditions, such as plasma gas pressure, gas compositions, and treatment temperature, in forming the nitrogen-containing layer by a plasma nitriding method.

The thickness of the (N, C, F, O) layer is preferably within the range of about 0.18 nm or more and 5 nm or less. As mentioned earlier, the (N, C, F, O) layer is useful as a barrier layer for preventing interdiffusion of Cu and Si at the interface between the Cu alloy layer and the first semiconductor layer; however, since the (N, C, F, O) layer is likely to be an insulator, the electrical resistance increases significantly if the thickness is excessively large, resulting in degradation of TFT performance. When the thickness of the (N, C, F, O)

layer is controlled to be within the above-described range, the increase in electrical resistance due to formation of the (N, C, F, O) layer can be suppressed to a range that does not adversely affect the TFT performance. The thickness of the (N, C, F, O) layer is preferably about 3 nm or less, more preferably 2 nm or less, and yet more preferably 1 nm or less. The thickness of the (N, C, F, O) layer can be determined by various physical analysis techniques. For example, the RBS method described above, an XPS (X-ray photoelectron spectroscopy) method, a SIMS (secondary ion mass spectrometry) method, a GD-OES (high-frequency glow discharge-optical emission spectroscopy) method, or the like can be employed. The upper limit and the lower limit of the thickness of the (N, C, F, O) layer can be freely combined to set the range.

The maximum value of the ratio of the number of atoms of the elements constituting the (N, C, F, O) layer to the number of Si atoms ((N, C, F, O)/Si) is preferably within the range of 0.5 or more and 1.5 or less. In this manner, the barrier effect of the (N, C, F, O) layer can be effectively exhibited without degrading the TFT characteristics. The maximum value of the above-described ratio is more preferably 0.6 or more and yet more preferably 0.7 or more. The ratio can be adjusted by controlling the plasma irradiation time to be in a range of about 5 seconds to 10 minutes. The ratio is calculated by analyzing the elements (N, C, F, O, and Si) in the depth direction of the (N, C, F, O) layer by a RBS method. Note that the upper limit and the lower limit of the maximum value of the ratio can be freely combined to set the range.

In order to form the (N, C, F, O) layer, at least one of nitrogen, carbon, fluorine, and oxygen may be supplied to the surface of the first semiconductor layer after formation of the first semiconductor layer. In particular, the above-described layer can be formed by using a plasma containing at least one of these elements. Alternatively, a nitrogen-containing layer may be formed by a thermal nitriding method or an amination method.

The method that uses a plasma is described below in detail. The plasma may use a gas containing at least one of nitrogen, carbon, fluorine, and oxygen. Examples of the gas that can be used include nitrogen-containing gas such as $N_2$, $NH_3$, $N_2O$, and NO; nitrogen-fluorine-containing gas such as $NF_3$; carbon-containing gas such as CO, $CO_2$, and hydrocarbon-based gas (ex., $CH_4$, $C_2H_4$, and $C_2H_2$); carbon-fluorine-containing gas such as fluorocarbon-based gas (ex., $CF_4$ and $C_4F_8$), and $CHF_3$; and oxygen-containing gas such as oxygen ($O_2$) and oxidizing gas containing oxygen atoms (ex., $O_3$). These gases can be used alone or in combination as a gas mixture.

An example of a method for supplying at least one of nitrogen, carbon, fluorine, and oxygen from a plasma source containing the above-described gas to the semiconductor layer surface is a method involving placing a semiconductor layer near the plasma source. Here, the distance between the plasma source and the semiconductor layer may be properly set according to various parameters such as plasma species, plasma generation power, pressure, and temperature. Usually, the distance is several centimeters to 10 cm from the plasma contact state. Atoms having high energy are present near the plasma and nitrogen, carbon, fluorine, oxygen, etc., are supplied to the semiconductor layer surface by using this high energy so that nitrides, carbides, fluorides, oxides, etc., can be formed on the semiconductor surface.

In addition to the method described above, for example, an ion implantation method may be utilized. According to this method, ions are accelerated by electric fields and can travel long distance. Thus, the distance between the plasma source and the semiconductor layer may be freely set. This method can be realized by using a special ion implantation system but a plasma ion implantation method is preferably used. A plasma ion plantation method is a technology with which ions can be uniformly implanted by applying a negative high voltage pulse to a semiconductor layer placed near a plasma.

Oxygen can be supplied to the semiconductor layer by a method other than the method described above since irradiating the semiconductor layer surface with UV light generates highly reactive ozone which oxidizes the semiconductor layer surface. Oxygen can also be supplied by subjecting the semiconductor surface to an acid dipping treatment using a hydrogen peroxide solution, nitric acid, or the like.

In order to simplify the production steps and shorten the treatment time in forming the (N, C, F, O) layer, the system, chambers, temperatures, and gas composition used in forming the above-described layer are preferably controlled as follows.

First, in order to simplify the production steps, the same system as the system for forming the semiconductor layer is preferably used and the process is preferably conducted in the same chamber of the same system. In this manner, the work to be treated does not have to be transferred between systems or within the system. The temperature is preferably substantially the same as the temperature for forming the semiconductor layer (margin of about $\pm 10°$ C. may be included) and thus the adjustment time accompanying the temperature change can be omitted.

As for the gas composition, (i) the (N, C, F, O) layer may be formed by using a gas containing at least one element selected from the group consisting of nitrogen, carbon, fluorine, and oxygen (nitrogen-containing gas, carbon-containing gas, fluorine-containing gas, oxygen-containing gas, etc., described above); (ii) the (N, C, F, O) layer may be formed by using a gas mixture of a gas containing at least one element selected from the group consisting of nitrogen, carbon, fluorine, and oxygen and a source gas used in forming the semiconductor layer; or (iii) the (N, C, F, O) layer may be formed by using a gas mixture of a gas containing at least one element selected from the group consisting of nitrogen, carbon, fluorine, and oxygen and a reducing gas. For example, a nitrogen-containing layer may be formed by using only a nitrogen-containing gas ($N_2$, $NH_3$, $NF_3$, or the like) containing at least nitrogen as in (i) but is preferably formed by using a gas mixture of a nitrogen-containing gas and a source gas ($SiH_4$) for forming the semiconductor layer as in (ii) above. When only the nitrogen-containing gas is used to form a nitrogen-containing layer, the gas for forming the semiconductor layer used must be completely discharged after formation of the semiconductor layer in order to purge the interior of the chamber. However, when the gas mixture is used as described above, there is no need to discharge gas and the treatment time can be shortened.

In (ii) above, the flow rate ratio of the gas containing at least one element selected from the group consisting of nitrogen, carbon, fluorine, and oxygen (hereinafter this gas is referred to as "(N, C, F, O) gas" for short, in particular, a nitrogen-containing gas) to the source gas used for forming the semiconductor layer (hereinafter this gas is referred to as "semiconductor source gas" for short), i.e., (N, C, F, O) gas/semiconductor source gas, is preferably controlled to 0.10 or more and 15 or less. As a result, the effect of shortening the treatment time can be effectively exhibited, the insulating property of the barrier layer is increased, and the decrease in the TFT characteristics (ON current OFF current) and the increase in contact resistance can be prevented. When the amount of the (N, C, F, O) gas is too small, the effect of preventing the interdiffusion of Cu and Si may not be effectively exhibited. In contrast, when the amount of the (N, C, F, O) gas is too large, the bonds in the thin film layers may become instable. The flow ratio (N, C, F, O) gas/semiconductor source gas is more preferably 0.3 to more and 10 or less and yet more preferably 0.5 or more and 7 or less. The upper limit and lower limit of the flow rate ratio may be freely combined to set the range.

Alternatively, the gas composition is preferably a gas mixture of the nitrogen-containing gas and a reducing-element-containing gas as in (iii). In this manner, the oxidization of the semiconductor layer can be further effectively suppressed. Examples of the reducing element include $NH_3$ and $H_2$. Since $NH_3$ serves as a nitrogen-containing gas as well as a gas having a reducing action, $NH_3$ can be used alone or in combination with $H_2$.

The Cu—Si diffusion layer is, as described above, obtained by forming the Cu alloy layer and the formation of the Cu—Si diffusion layer is preferably further promoted by the heat history applied during the subsequent step of producing the TFT where Cu in the Cu alloy layer diffuses into Si in the second semiconductor layer. The Cu—Si diffusion layer has an effect of protecting the (N, C, F, O) layer from contamination with air. The thickness of the Cu—Si diffusion layer is preferably properly adjusted according to the TFT characteristics desired and is preferably about 0.2 nm or more and 200 nm or less. In particular, the thickness need be thicker than a Cu—Si monoatomic layer (about 0.2 nm) and the thickness is preferably 200 nm or less since the Cu—Si diffusion layer is preferably as thin as possible from the viewpoint of TFT production.

The second semiconductor layer has, as described above, an effect of protecting the (N, C, F, O) layer from contamination by air by forming a Cu—Si diffusion layer through diffusion of Cu in the Cu alloy layer. However, when its thickness is excessively large, the electrical resistivity of the Cu alloy layer as a whole (first layer+second layer) may increase. From the viewpoint of electrical resistivity, the thickness of the second semiconductor layer is preferably 45 nm or less.

The Cu alloy layer used in the present invention is described next. The Cu alloy layer of the present invention has a multilayer structure including a first layer and a second layer in that order from the substrate side.

Regarding the First Layer

The first layer is a Cu—X alloy layer containing an alloy component X (wherein X is at least one selected from the group consisting of Zn, Ni, Ti, Al, Mg, Ca, W, Nb, and Mn). When such a first layer is provided, the adhesion to the semiconductor layer (this semiconductor layer may be a semiconductor layer that changes into a Cu—Si diffusion layer and thus may be a first semiconductor layer or a second semiconductor layer. This definition applies thereafter when the adhesion between the Cu alloy layer and the semiconductor layer is discussed in the present invention) can be improved without interposing a barrier metal layer and the contact resistance with the semiconductor layer can be decreased. These elements X are selected as element that dissolve in a Cu metal but not in a Cu oxide film. Presumably, when a Cu alloy in which these elements are dissolved is oxidized by a heat treatment during film formation, the elements are diffused and found in grain boundaries and interfaces at high concentrations, resulting in improved adhesion to the semiconductor layer due to this concentrated layer. These elements can exhibit the adhesion without adversely affecting the usefulness of Cu (low electrical resistance and low contact resistance of Cu).

Among the elements X listed above, Mn and Ni are preferable and Mn is more preferable. In particular, Mn offers excellent adhesion. Mn is an element that strongly exhibits a concentration phenomenon at the interface described above and migrates from inside the film to outer side of the film during formation of the Cu alloy or a heat treatment carried out after formation of the Cu alloy (e.g., the heat history applied during the process of fabricating a display apparatus such as a step of forming a SiN insulating film is also included). The migration of Mn toward the interface is further accelerated since Mn oxides generated by the oxidation induced by the heat treatment acts as driving force. As a result, the adhesion to the semiconductor layer is improved.

The X content in the Cu—X alloy layer (first layer) is preferably 0.5 to 20 at %. When one of the elements listed as elements X above is used alone, the content of this one element is to satisfy the above-described range. When two or more of the elements are used in combination, their total content is to satisfy the above-described range. When the X content is less than 0.5 at %, the adhesion and the low contact resistance to the semiconductor layer may not be achieved. In contrast, when the X content exceeds 20 at %, the electrical resistance of the Cu—X alloy film increases and thus the contact resistance may increase. The preferable range for the X content is 5 to 15 at %. The upper limit and the lower limit of the X content described above may be freely combined to set the range.

The thickness of the Cu—X alloy layer (first layer) is preferably 5 to 150 nm and 50% or less of the entire film thickness of the Cu alloy layer. When the thickness is less than 5 nm, Cu atoms in the second layer described below easily pass through the Cu—X alloy layer (first layer) and reach the semiconductor layer during a heat treatment in the TFT production process, possibly resulting in an excessively thick Cu—Si diffusion layer and an increase in contact resistance. When the thickness is less than 5 nm, the adhesion may not be ensured. In contrast, when the thickness exceeds 150 nm or the ratio of the thickness relative to the entire film thickness of the Cu alloy layer exceeds 50%, the electrical resistance of the Cu alloy layer as a whole (first layer+second layer) increases, and the problem of heat from wiring may become severe. The thickness of the Cu—X alloy layer (first layer) is preferably 20 to 100 nm and more preferably 20 to 60 nm. The upper limit the lower limit of the thickness of the Cu—X alloy layer may be freely combined to set the range.

In order to maximize the adhesion improving effect, the element X content and the thickness of the first layer are preferably controlled in association with each other instead of controlling them separately. This is because the experimental results found by the inventors have found that the total amount of elements X in the first layer is closely associated with the adhesion to the semiconductor layer. In other words, the thickness is preferably increased when the element X content is low and the element X content is preferably increased when the thickness is small. More specifically, the X content y (at %) in the Cu—X alloy layer (first layer) and the thickness x (nm) of the Cu—X alloy layer (first layer) preferably satisfy the relationship of formula (1) below:

$$Y \geq 0.085x + 8.0 \qquad (1)$$

When the relationship of formula (1) is not satisfied, the adhesion may be insufficient. The adhesion improves as the thickness is increased as long as formula (1) is satisfied; however, as described above, the electrical resistance of the Cu alloy layer as a whole may increase if the thickness is excessively large. Thus, the thickness is preferably properly controlled by considering the balance between the adhesion and the electrical resistance.

The Cu—X alloy constituting the Cu—X alloy layer (first layer) may further contain Fe and/or Co at a total (if only one is used, the amount of that element alone) of 0.02 to 1.0 at %. As a result, a low electrical resistivity is achieved and the adhesion to the semiconductor layer is improved. The content is preferably 0.05 at % or more and 0.8 at % or less and more preferably 0.1 at % or more and 0.5 at % or less. The upper limit and lower limit of Fe and/or Co content may be freely combined to set the range.

Regarding the Second Layer

In the Cu alloy layer of the present invention, the second layer is formed on (directly on) the first layer and is composed of pure Cu or a Cu alloy mainly composed of Cu having an electrical resistivity lower than that of the first layer. The meaning of the "mainly composed of Cu" is that among the elements contained in the Cu alloy, Cu is contained in the largest amount. The Cu content in the Cu alloy cannot be uniformly defined since it differs depending on the alloy elements used but, for example, is preferably 60 at % or more (preferably 70 at % or more) and less than 100 at % (preferably 99.9 at % or less). When such a second layer is provided, the electrical resistivity of the Cu alloy layer as a whole can be suppressed to a low level. Here, the Cu alloy having an electrical resistivity lower than that of the first layer may be prepared by properly controlling the type and/or content of the alloy element so that the electrical resistivity is lower than that of the first layer composed of Cu—X alloy containing the element X. Elements having low electrical resistivity (element having electrical resistivity as low as that of pure Cu alloys) can be easily selected from known elements by referring to figures etc., described in literatures. However, the alloy elements that can be used in the second layer are not necessarily limited to those elements which have low electrical resistivity since the electrical resistivity can be decreased by decreasing the content (about 0.05 to 1 at %) of the element having high electrical resistivity. To be specific, for example, Cu-0.5 at % Ni, Cu-0.5 at % Zn, and Cu-0.3 at % Mn are preferably used. The alloy that can be used in the second layer may contain a gas component such as an oxygen gas or nitrogen gas and, for example, Cu—O or Cu—N can be used.

The thickness of the Cu alloy layer as a whole (first layer+ second layer) can be properly set according to the desired TFT characteristics but is preferably about 10 nm to 1 μm, more preferably 30 nm to 800 nm, and yet more preferably 50 nm to 600 nm. The upper limit and lower limit of the thickness of the Cu alloy layer as a whole may be freely combined to set the range.

The first layer and the second layer of the Cu alloy layer used in the present invention both contain the elements described above, the balance being Cu and inevitable impurities.

The Cu alloy layer of the present invention having the above-described multilayer structure is preferably formed by a sputtering method. In particular, after a film was formed by a sputtering method by using materials constituting the first layer, a film is formed thereon by a sputtering method by using materials constituting the second layer to form a multilayer structure. The Cu alloy multilayer film formed as such is then preferably patterned and tapered to have a cross-section having a tapered shape with a taper angle of about 45 to 60° from the viewpoint of coverage.

A Cu alloy layer having substantially the same composition as that of a sputtering target can be formed by a sputtering method. This means that the composition of the Cu alloy layer can be adjusted by adjusting the composition of the sputtering target. The composition of the sputtering target may be adjusted by using a Cu alloy target having a different composition or by placing chips of metals of alloy elements on a pure Cu target.

According to the sputtering method, there may be a slight difference between the composition of the Cu alloy layer deposited and the composition of the sputtering target. However, this difference is about several atomic percent. A Cu alloy layer having a desired composition can be formed by controlling the composition of the sputtering target within ±10 at % at maximum.

The substrate used in the present invention may be any. Examples thereof include non-alkali glass, high-strain-point glass, and soda lime glass.

Second Embodiment of the Present Invention

A second embodiment of the TFT according to the present invention is an example that has a first semiconductor layer, a (N, C, F, O) layer, and another first semiconductor layer between the TFT substrate and the (N, C, F, O) layer constituting the two-layer structure in the first embodiment described above. In particular, as shown in FIG. 2, a first semiconductor layer, a (N, C, F, O) layer, and another first semiconductor layer are stacked in that order on a TFT substrate, a two-layer structure including a (N, C, F, O) layer and a Cu—Si diffusion layer is disposed thereon, and a Cu alloy layer is directly formed on the two-layer structure.

Third Embodiment of the Present Invention

Figure 4:
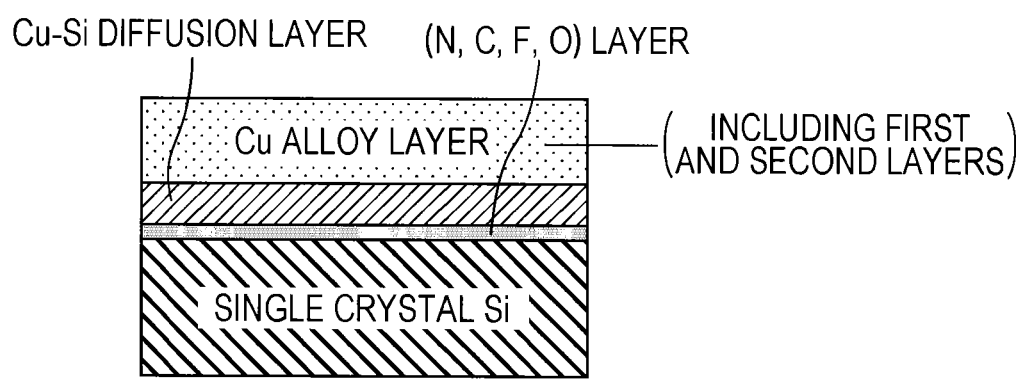
FIG. 4 is a schematic cross-sectional diagram showing a structure of a MOSFET according to a third embodiment of the present invention.
Figure 5:
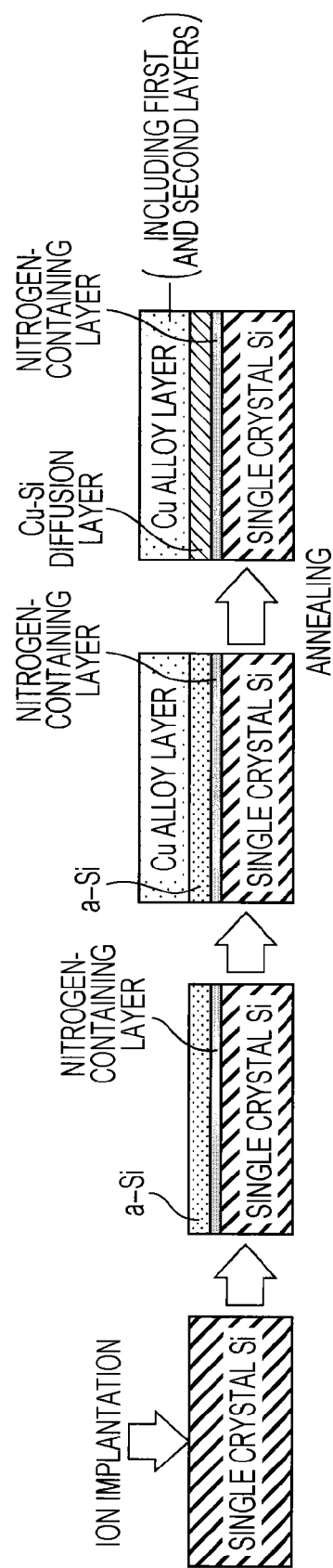
FIG. 5 is a step diagram illustrating the steps of forming the wiring structure according to the third embodiment of the present invention.

A first embodiment of a MOSFET according to the present invention is shown in FIG. 4. In FIG. 4, a two-layer structure including a (N, C, F, O) layer and a Cu—Si diffusion layer is directly formed on single crystal Si and a Cu alloy layer is directly formed on the two-layer structure. This structure is formed by the steps shown in FIG. 5. That is, among N, C, F, and O, for example, nitrogen is implanted into a single crystal Si substrate by an ion implantation method or the like. During this process, implanted nitrogen exhibits a substantially Gaussian distribution in the depth direction around a particular depth (referred to as trajectory). Part of Si becomes amorphous by damage done by implanted nitrogen. Next, a Cu alloy layer is formed by sputtering and plating and then a heat treatment such as annealing is performed to form a Cu alloy layer (including first and second layers)/Cu—Si diffusion layer/nitrogen-containing layer/single crystal Si structure.

The embodiment described above has the same wiring structure as the first embodiment of the TFT described above. The embodiment of the MOSFET is not limited to the above-described example. For example, a structure substantially the same as those of the first and second embodiments of the TFTs can be employed.

A method for producing a MOSFET (metal-oxide-semiconductor field effect transistor) will now be described with reference to step diagrams of FIGS. 8(a) to (k). Here, a process of forming a device isolation pattern by local oxidation on a single crystal p-type Si substrate (LCOS: local oxidation of Si) and then forming a MOSFET in an active region (region not subjected to local oxidation) of the device is described. In the description below, an example that uses polysilicon is described. However, the present invention is not limited to this.

First, a gate insulating film is formed on a single crystal p-type Si substrate by thermal oxidation or the like (FIG. 8(a)). Then a film of P-doped polysilicon is formed by CVD or the like (FIG. 8(b)). Then a resist is patterned by lithography (FIG. 8(c)). The polysilicon is dry-etched by using this resist as a mask (FIG. 8(d)). Then As is implanted into the substrate by an ion implantation method or the like and a source-drain region is formed by activation annealing (FIG. 8(e)). Then an interlayer insulating film is formed by CVD or the like (FIG. 8(f)). Lithographic patterning (FIG. 8(g)) and dry etching is performed to form contact holes for connecting the metal wiring film (Cu alloy layer) to the source-drain region (FIG. 8(h)). Then a Cu alloy layer (including first and second layers)/Cu—Si diffusion layer/nitrogen-containing layer/single crystal Si structure is formed through the steps shown in FIG. 5 described above. In other words, nitrogen is implanted into the substrate by an ion implantation method or the like. During this process, implanted nitrogen exhibits a substantially Gaussian distribution in the depth direction around a particular depth (called trajectory). Part of Si becomes amorphous due to damage caused by implanted nitrogen (FIG. 8(i)). Next, a Cu-based alloy film is formed by sputtering and plating (FIG. 8(j)) and CMP (chemical mechanical polish) is performed to form a wiring pattern. Lastly, annealing is performed to obtain a MOSFET having a Cu—Si diffusion layer (FIG. 8(k)).

EXAMPLES

The present invention will now be described in more detail by using examples. However, the present invention is not limited by the examples below and various alterations and modifications are possible within a range that conforms with the matter described above and below and fall within the technical scope of the present invention.

Example 1

Evaluation of Adhesion

In Example 1, samples including Cu alloy layers and first layers having various compositions were prepared as described above and the adhesion between the Cu alloy layer and the semiconductor layer was evaluated.

First, a low-resistance amorphous silicon film (n-a-Si:H layer) having a thickness of 200 nm and doped with an impurity (P) was formed on a glass substrate by a plasma CVD method. This low-resistance amorphous silicon film (n-a-Si:H layer) was formed by performing plasma CVD with $SiH_4$ and $PH_3$ as source gases. The film-forming temperature during plasma CVD was set to 320° C.

In the same chamber of the same plasma CVD system, only nitrogen gas is supplied to generate a plasma and the surface of the low-resistance amorphous silicon film was treated with the nitrogen plasma for 30 seconds to form a nitrogen-containing layer. The RF power density applied to the plasma was about 0.3 W/cm$^2$, the film-forming temperature was 320° C., and the gas pressure was 67 Pa. The surface was analyzed by a RBS method and an XPS method and, as a result, formation of a nitrogen-containing layer having a thickness of about 1 nm was confirmed.

Next, without discharging the substrate from the CVD system, a low-resistance amorphous silicon film having a thickness of 10 nm and doped with an impurity (P) was formed continuously. A Cu—Mn alloy film was formed thereon by a sputtering method under various random conditions (Mn content and film thickness) as shown in FIG. 9, and a 500 nm pure Cu film was formed on the Cu—Mn alloy film. The film-forming temperature during sputtering was set to room temperature. Next, the resist was patterned by photolithography and the Cu alloy film was etched by using the resist as a mask to form a pattern for adhesion testing. Note that the Cu—Si diffusion layer in the present invention is formed at the time when the Cu alloy film is formed. Thus, in this example, the adhesion evaluation test was conducted after formation of the Cu alloy film. Since formation of the Cu—Si diffusion layer is further promoted by performing a heat treatment after formation of the Cu alloy film, adhesion equal to or higher than that exhibited after the formation of the Cu alloy film will be realized.

Adhesion was evaluated by a peel test using an adhesive tape. In particular, a grid constituted by scribing lines 1 mm spaced from each other was formed in the surface of the Cu alloy film with a utility knife. Then a black polyester tape produced by Sumitomo 3M Limited (product number: 8422B) was tightly attached onto the Cu alloy film and peeled off in one operation at a tape peel angle of 60°. The number of segments in the grid that had separated due to the tape was counted and the ratio relative to all segments (film separation ratio) was determined. Measurement was conducted three times and the average of three measurements was assumed to be the film separation ratio of each sample.

In this example, samples with a film separation ratio of 0% to less than 5% were indicated by open circles, samples with a film separation ratio of 5% or more and less than 50% are indicated by open triangles, and samples with a film separation ratio of 50% or more are indicated by Xs. The results are shown in FIG. 9.

FIG. 9 showing the results of the adhesion evaluation test shows that it is effective to control the Mn content y (at %) in the first layer in association with the thickness x (nm) of the first layer in order to enhance the adhesion between the Cu alloy layer and the semiconductor layer. Moreover, the relationship between y (at %) and x (nm) can be organized by the formula $y \geq 0.085x + 8.0$. The adhesion can be improved when the relationship is satisfied.

Example 2

Measurement of Contact Resistance

In order to study the contact resistance between the Cu-alloy layer and the semiconductor layer shown in Tables 1 to 3 (in these tables, only the composition/thickness of the first layer is described and the second layer is composed of pure Cu) by TLM (transfer length method), TLM devices were prepared.

First, a low-resistance amorphous silicon film (n-a-Si:H layer) having a thickness of about 200 nm doped with an impurity (P) was formed by a plasma CVD method on a glass substrate. Then in the same plasma CVD system, a plasma was generated by feeding only nitrogen gas and the surface of the low-resistance amorphous silicon film was treated with the plasma for 30 seconds to form a nitrogen-containing layer. The RF power density applied to the plasma was about 0.3 W/cm$^2$, the film-forming temperature was 320° C., and the gas pressure was 67 Pa.

Without discharging the substrate from the CVD system, a low-resistance amorphous silicon film (thickness: 10 nm) doped with an impurity (P) was again formed continuously. A Cu—X alloy was sputter-deposited thereon under the conditions (composition of the first layer and the thickness of the first layer) shown in Tables 1 to 3, and a pure Cu film having a thickness of 300 nm was formed thereon. The film-forming temperature during sputtering was set to room temperature. The resist was patterned by photolithography and the Cu alloy film was etched by using the resist as a mask to prepare a TLM evaluation device. Lastly, a heat treatment was performed at 300° C. for 30 minutes to form a Cu—Si diffusion layer.

Figure 6:
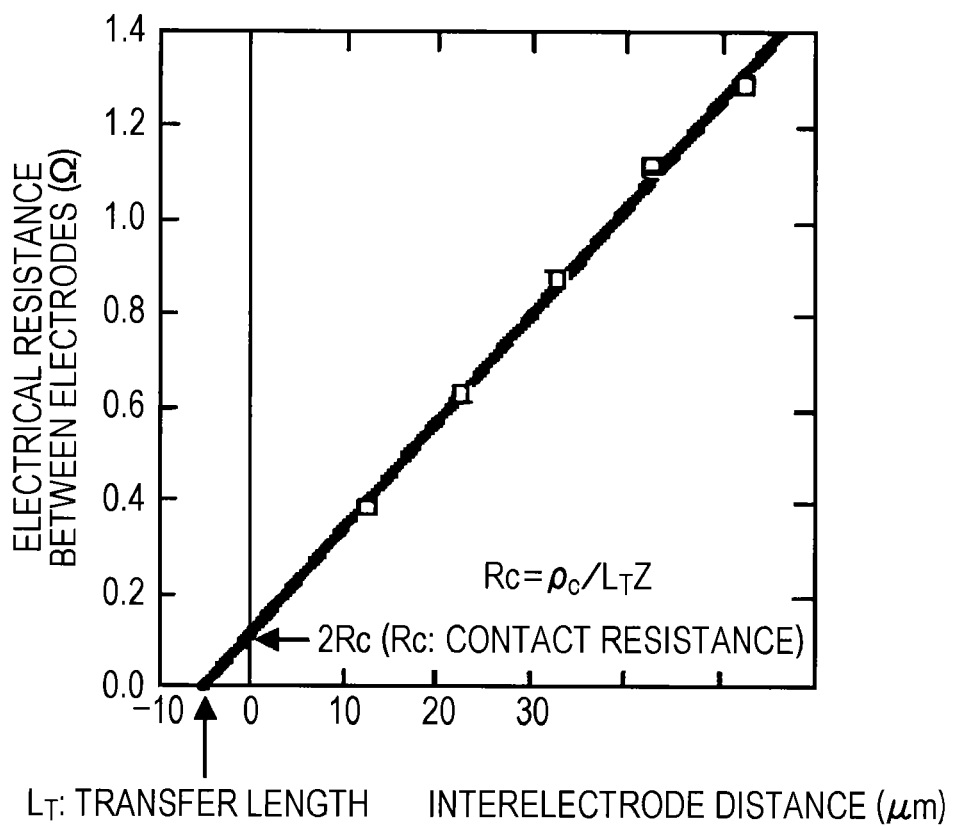
FIG. 6 is a graph showing the relationship between the interelectrode distance and the electrical resistance.
Figure 7:
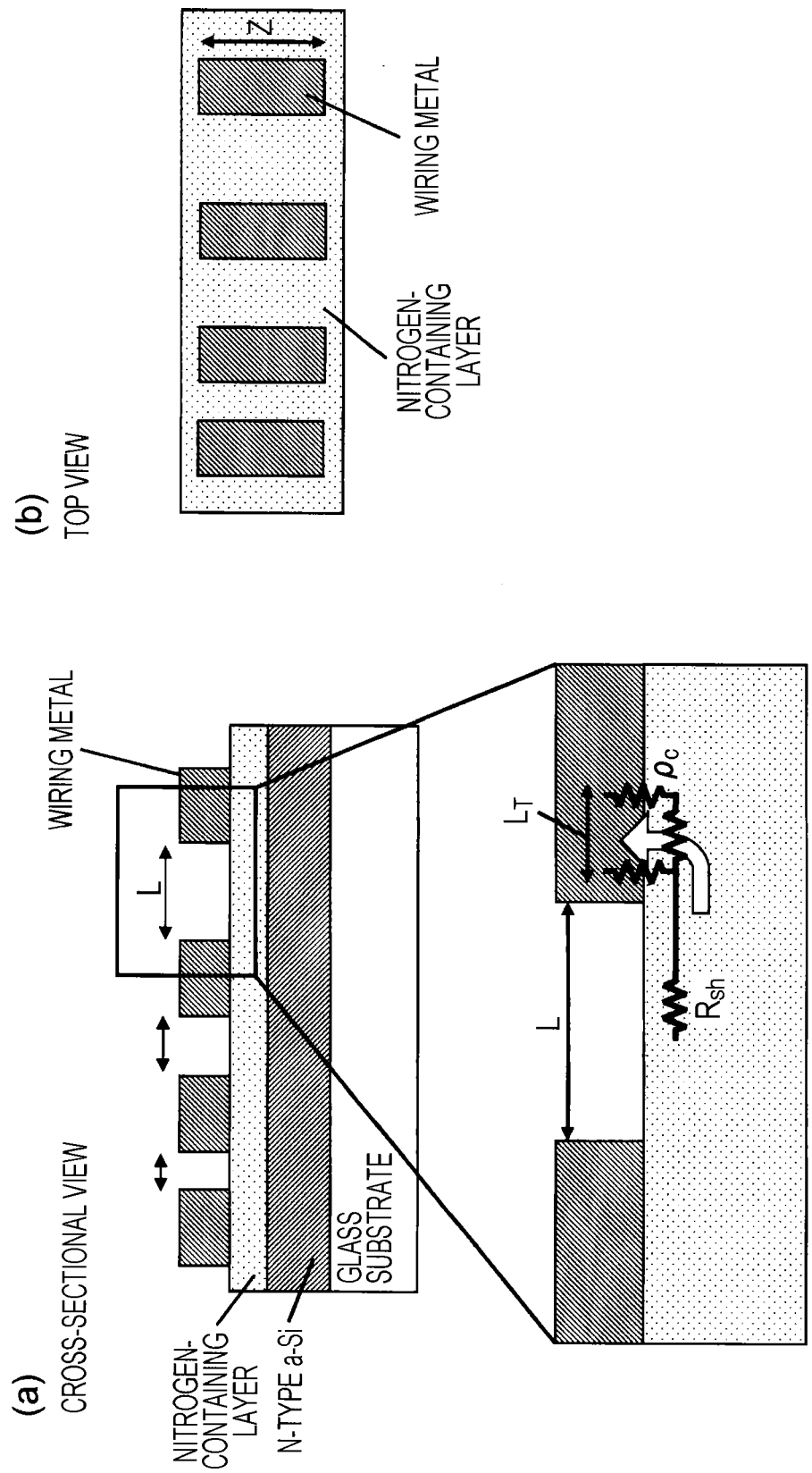
FIG. 7($a$) to ($b$) are diagrams illustrating the principle of measuring contact resistance by using a TLM device.

Next, the principle of measuring the contact resistance by TLM is described with reference to FIGS. 6 and 7(a) to 7(b). FIG. 7(a) is a schematic cross-sectional view of a wiring structure after forming a Cu—Si diffusion layer by the process described above and FIG. 7(b) is a top view thereof. In FIG. 7(a), the Cu—Si diffusion layer is omitted.

In the wiring structure shown in FIG. 7(a), a current-voltage characteristic between a plurality of electrodes was measured and the resistance value between the electrodes was determined. The results were plotted versus a vertical axis indicating the resistance value between the electrodes and a horizontal axis indicating the interelectrode distance (transfer length, L) and a graph shown in FIG. 6 was obtained. In the graph of FIG. 6, the value of the y intercept and the value of the x intercept respectively correspond to double (2Rc) the contact resistance Rc and the effective contact length ($L_T$, transfer length). Accordingly, the contact resistance $\rho c$ is expressed by the formula below:

$$\rho_c = Rc \times L_T \times Z$$

In the formula, Z represents the electrode width as shown in FIG. 7(b).

The results are shown in Tables 1 to 3. In Table 1, the results of the case in which pure Cu was used in the first layer are indicated for comparison purposes.

TABLE 1

| Composition of first layer | Contact resistance ($\Omega \cdot cm^2$) |
|---|---|
| Pure Cu | 0.25 |
| Cu—0.5 at % Mn | 0.21 |
| Cu—2 at % Mn | 0.20 |
| Cu—4 at % Mn | 0.18 |
| Cu—6 at % Mn | 0.19 |
| Cu—10 at % Mn | 0.15 |
| Cu—15 at % Mn | 0.16 |
| Cu—20 at % Mn | 0.13 |

*Thickness of first layer is 20 nm in all samples.

TABLE 2

| Thickness of first layer (nm) | Contact resistance ($\Omega \cdot cm^2$) |
|---|---|
| 5 | 0.22 |
| 10 | 0.18 |
| 20 | 0.15 |
| 50 | 0.16 |
| 80 | 0.17 |
| 100 | 0.14 |

*Composition of first layer is Cu—10 at % Mn in all samples.

TABLE 3

| Composition of first layer | Contact resistance ($\Omega \cdot cm^2$) |
|---|---|
| Cu—4 at % Ni | 0.22 |
| Cu—4 at % Zn | 0.23 |
| Cu—4 at % Mg | 0.18 |
| Cu—10 at % Ni | 0.21 |
| Cu—10 at % Zn | 0.15 |
| Cu—10 at % Mg | 0.22 |

*Thickness of first layer is 50 nm in all samples.

All of Examples in Tables 1 to 3 (excluding sample of pure Cu in Table 1) are wiring structures that satisfy the requirements of the present invention and the contact resistance with the semiconductor layer measured by using TLM evaluation devices is 0.1 to 0.3 $\Omega cm^2$. In other words, the contact resistance between the semiconductor layer and the wiring structure of the present invention is substantially equal to or lower than that of the pure Cu and a practical low contact resistance was exhibited.

The first layer shown in Table 2 has an Mn content and a first layer thickness that satisfy the desirable relationship defined by the present invention and exhibits not only adhesion but also low contact resistance with the semiconductor layer. Table 3 indicates examples that use Ni, Zn and Mg as element X and these examples achieve low contact resistance.

Example 3

Measurement of Electrical Resistivity

In this example, the relationship between the thickness of the first layer and the electrical resistivity of the Cu alloy layer as a whole (first layer+second layer) and the relationship between the element X content in the first layer and the electrical resistivity of the Cu alloy layer as a whole (first layer+second layer) were studied.

As with the adhesion evaluation test samples of Example 1, Cu—Mn alloy films were formed as a first layer under various conditions (thickness of first layer and Mn content) shown in Tables 4 and 5 and pure Cu films were formed thereon (the thickness of the Cu alloy layer as a whole was 300 nm).

Subsequently, each sample was processed into a pattern for evaluating electrical resistance having a line width of 100 μm and a line length of 10 mm through photolithography and wet-etching. During this process, a phosphoric acid:sulfuric acid:nitric acid:acetic acid (50/10/5/10) mixed acid solution was used as a wet etchant. Then using a single wafer CVD system, a heat treatment was conducted by heating the substrate at 350° C. for 30 minutes and the electrical resistance after the heat treatment was measured at room temperature by a DC four probe method.

The results are shown in Tables 4 and 5.

TABLE 4

| Thickness of first layer (nm) | Electrical resistivity ($\mu\Omega \cdot cm$) |
|---|---|
| 20 | 2.0 |
| 30 | 2.0 |
| 50 | 2.0 |
| 80 | 2.2 |
| 100 | 2.5 |
| 120 | 2.6 |
| 150 | 3.0 |

*Composition of first layer was Cu—8 at % Mn in all samples.

TABLE 5

| Composition of first layer | Electrical resistivity ($\mu\Omega \cdot cm$) |
|---|---|
| Cu—4 at % Mn | 2.0 |
| Cu—6 at % Mn | 2.0 |
| Cu—8 at % Mn | 2.0 |
| Cu—10 at % Mn | 2.2 |
| Cu—16 at % Mn | 2.5 |
| Cu—20 at % Mn | 2.6 |

*Thickness of first layer was 50 nm in all samples.

As shown in Table 4, the electrical resistivity of the Cu alloy layer as a whole tends to increase with the increase in thickness of the first layer. As shown in Table 5, the electrical resistivity of the Cu alloy layer as a whole tends to increase with the increase in the Mn content in the first layer. However, in all examples shown in Tables 4 and 5, the electrical resistivity of the Cu alloy layer as a whole is at a practical low level.

Example 4

Studying the Relationship Between Thickness of Second Semiconductor Layer and Electrical Resistivity In this example, the relationship between the thickness of the second semiconductor layer and the electrical resistivity of the Cu alloy layer as a whole (first layer+second layer) was studied.

First, a low-resistance amorphous silicon film (n-a-Si:H layer) having a thickness of about 200 nm and doped with an impurity (P) was formed on a glass substrate by a plasma CVD method. Then, in the same plasma CVD system, only nitrogen gas was supplied to generate a plasma and the surface of the low-resistance amorphous silicon film was treated with the nitrogen plasma for 30 seconds to form a nitrogen-containing layer. The RF power density applied to the plasma was about 0.3 W/cm$^2$, the film-forming temperature was 320° C., and the gas pressure was 67 Pa.

Without discharging the substrate from the CVD system, a low-resistance amorphous silicon film doped with an impurity (P) was again continuously formed as a second semiconductor layer. The thickness of the second semiconductor layer formed this time was 0 nm to 50 nm. A Cu-10 at % Mn was formed thereon as a first layer and then a pure Cu film was sputter-deposited on the first layer so that the thickness of the Cu alloy layer as a whole was 300 nm. The film-forming temperature during sputtering was set to room temperature. For the evaluation of the alloy film, a pattern similar to one prepared in Example 3 was formed through photolithography, wet-etching, and dry-etching. A phosphoric acid:sulfuric acid:nitric acid:acetic acid (50/10/5/10) mixed acid solution was used as a wet etchant. Then using a single waver CVD system, a heat treatment was conducted by heating the substrate at 300° C. for 30 minutes and the electrical resistance after the heat treatment was measured at room temperature by a DC four probe method.

The results are shown in FIG. 10.

FIG. 10 shows that the electrical resistivity of the Cu alloy layer as a whole increases with the increase in thickness of the second semiconductor layer. The electrical resistance of the wiring film is preferably decreased to lower than 5.0 μΩcm, which is the electrical resistivity of a wiring film of existing art in which a Al—Nd/Mo multilayer structure was heat-treated at 300° C. for 30 minutes, for example. Based on the results described above, the thickness of the second semiconductor layer is preferably 45 nm or less when the heat treatment is conducted at 300° C. for 30 minutes. The rate of increase in electrical resistance can be adjusted by adjusting the heat treatment temperature and time but the thickness is preferably about 45 nm or less.

Example 5

Measurement of TFT Characteristics

In this example, the TFT characteristics exhibited when the wiring structure of the present invention was applied to the source/drain wiring were studied.

First, a Cu alloy film was formed as gate wiring on a glass substrate by a DC magnetron sputtering method. Then a gate insulating film SiN having a thickness of about 200 nm was formed by a plasma CVD method. Without discharging the substrate from the CVD system, an a-Si semiconductor layer having a thickness of about 200 nm was continuously formed and then a 40 nm low-resistance amorphous silicon film (n$^+$-a-Si layer) doped with an impurity (P) was formed. In the same plasma CVD system, only nitrogen gas was supplied to generate a plasma and the surface of the low-resistance amorphous silicon film was treated with the nitrogen plasma for 30 seconds to form a nitrogen-containing layer. The RF power density applied to the plasma was about 0.3 W/cm$^2$, the film-forming temperature was 320° C., and the gas pressure was 67 Pa. Then, in the same plasma system, another low-resistance amorphous silicon film doped with an impurity (P) was formed as a second semiconductor layer. The thickness of the second semiconductor layer formed this time was 5 nm.

Then a Cu-10 at % Mn was formed as a first layer of the source/drain wiring by a DC magnetron sputtering method and then a pure Cu film was formed on the Cu-10 at % Mn film by sputter deposition so that the thickness of the Cu alloy layer as a whole was 300 nm. The substrate temperature during sputtering was set to room temperature.

Subsequently, a channel was formed by photolithography and etching and a heat history simulating the passivation film forming temperature (300° C. for 30 minutes) was applied to thereby form a TFT structure. To be more specific, after a pattern was formed by photolithography, the Cu alloy layer was etched with a wet etchant Cu-02 (Kanto Kagaku Kabushiki Kaisha) and then the n$^+$-a-Si (second semiconductor layer), the (N, C, F, O) layer, and the n$^+$-a-Si layer were dry-etched. In dry etching, the RF power density was set to 50 W, the gas ratio Ar:SF6=80:5, and the gas pressure was 60 Pa. Lastly, a heat history simulating the passivation film forming temperature (300° C. for 30 minutes) was applied so as to form a TFT structure. The Id-Vg characteristic of the TFT prepared by this process is shown in FIG. 11.

Figure 11:
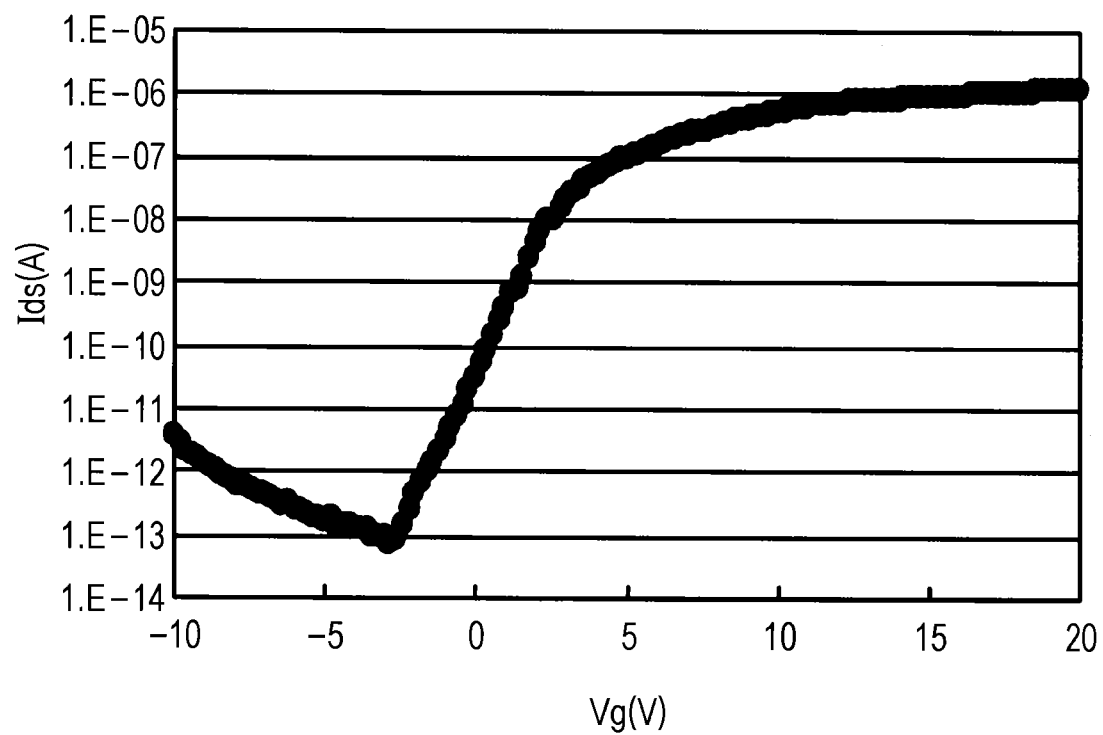
FIG. 11 is a graph showing the Ids-Vg characteristic of a TFT to which the wiring structure of the present invention is applied.

The graph in FIG. 11 shows that the ratio of the OFF current to the ON current is about 6 digit, which is substantially equal to the OFF current/ON current ratio of a TFT that uses a conventional Cu/Mo multilayer structure (multilayer structure that includes a barrier metal layer such as Mo between the Cu-based alloy wiring film and the semiconductor layer of the TFT). Accordingly, it was found that the TFT to which the present invention was applied can operate without any problem.

Although the invention of the present application has been described with reference to specific embodiments above, it is obvious for persons skilled in the art that various alterations and modifications can be made without departing from the spirit and scope of the present invention.

The present application is based on Japanese Patent Application (No. 2010-08648) filed on Apr. 2, 2010, the entire contents of which are incorporated herein by reference.

INDUSTRIAL APPLICABILITY

The present invention can provide a direct contact technology that enables a Cu alloy layer and a semiconductor layer to come into direct contact with each other, offers excellent contact resistance between the Cu alloy layer and the semiconductor layer, and achieves high productivity and further enlarged process margins. In particular, a technology that is less susceptible to variations in various processing conditions (variation in system performance, instability, unexpected contamination, contamination that is hard to control, etc.), that does not need stringent condition control, and that has less limitations on process conditions can be provided. Since the first layer of the Cu alloy layer is a Cu—X alloy layer (first layer) containing X as an alloy component (X is at least one selected from the group consisting of Zn, Ni, Ti, Al, Mg, Ca, W, Nb, and Mn) and the second layer is a layer composed of Cu or a Cu alloy mainly composed of Cu and having an electrical resistivity lower than that of the first layer, the adhesion to the semiconductor layer is improved, low contact resistance is achieved, and the increase in electrical resistance of the Cu alloy layer as a whole can be suppressed.

The invention claimed is:

1. A wiring structure, comprising a semiconductor layer and a Cu alloy layer on a substrate in that order from the substrate side,
wherein:
a multilayer structure comprising an (N, C, F, O) layer comprising at least one element selected from the group consisting of nitrogen, carbon, fluorine, and oxygen and a Cu—Si diffusion layer comprising Cu and Si disposed in that order from the substrate side is interposed between the semiconductor layer and the Cu alloy layer, such that at least one element of the (N, C, F, O) layer is bonded to Si in the semiconductor layer; and
the Cu alloy layer comprises a multilayer structure comprising, in the following order from the substrate side, a first layer comprising a Cu—X alloy layer comprising at least one alloy component X selected from the group consisting of Zn, Ni, Ti, Al, Mg, Ca, W, Nb, and Mn and a second layer comprising pure Cu or a Cu alloy mainly comprising Cu and having an electrical resistivity lower than that of the first layer.

2. The wiring structure according to claim 1, wherein a content of the alloy component X in the first layer is 0.5 to 20 at %.

3. The wiring structure according to claim 1, wherein a thickness of the first layer is 5 to 150 nm and 50% or less of a thickness of the Cu alloy layer as a whole.

4. The wiring structure according to claim 2, wherein a thickness of the first layer is 5 to 150 nm and 50% or less of a thickness of the Cu alloy layer as a whole.

5. The wiring structure according to claim 1, wherein a thickness x (nm) and an X content y (at %) of the first layer satisfy formula (1):

$$y \geq -0.085x + 8.0 \qquad (1).$$

6. The wiring structure according to claim 2, wherein a thickness x (nm) and an X content y (at %) of the first layer satisfy formula (1):

$$y \geq -0.085x + 8.0 \qquad (1).$$

7. The wiring structure according to claim 1, wherein the Cu—Si diffusion layer is obtained by forming the (N, C, F, O) layer, a semiconductor layer, and the Cu alloy layer in that order and then applying a heat history.

8. The wiring structure according to claim 2, wherein the Cu—Si diffusion layer is obtained by forming the (N, C, F, O) layer, a semiconductor layer, and the Cu alloy layer in that order and then applying a heat history.

9. The wiring structure according to claim 1, wherein the semiconductor layer comprises hydrogenated amorphous silicon or amorphous silicon.

10. The wiring structure according to claim 2, wherein the semiconductor layer comprises hydrogenated amorphous silicon or amorphous silicon.

11. A display apparatus, comprising the wiring structure according to claim 1.

12. A semiconductor device, comprising the wiring structure according to claim 1.

* * * * *